US009793941B1

(12) United States Patent
Hirsch

(10) Patent No.: US 9,793,941 B1
(45) Date of Patent: Oct. 17, 2017

(54) APPARATUS TO ASSIST A USER WITH HOLDING A MOBILE DEVICE

(71) Applicant: Allen Hirsch, New York, NY (US)

(72) Inventor: Allen Hirsch, New York, NY (US)

( * ) Notice: Subject to any disclaimer, the term of this patent is extended or adjusted under 35 U.S.C. 154(b) by 0 days.

(21) Appl. No.: 15/169,597

(22) Filed: May 31, 2016

(51) Int. Cl.
| | |
|---|---|
| H04M 1/00 | (2006.01) |
| H04B 1/3888 | (2015.01) |
| A45C 11/00 | (2006.01) |
| A45F 5/00 | (2006.01) |
| H04B 1/3827 | (2015.01) |

(52) U.S. Cl.
CPC ............ *H04B 1/3888* (2013.01); *A45C 11/00* (2013.01); *A45F 5/00* (2013.01); *H04B 1/385* (2013.01); *A45C 2011/002* (2013.01); *A45C 2011/003* (2013.01); *H04B 2001/3861* (2013.01)

(58) Field of Classification Search
None
See application file for complete search history.

(56) References Cited

U.S. PATENT DOCUMENTS

| | | |
|---|---|---|
| 4,211,445 A | 7/1980 | Woods |
| 6,016,248 A | 1/2000 | Anzai et al. |
| 6,217,095 B1 | 4/2001 | Yamada |
| 6,250,553 B1 | 6/2001 | Beseth |
| 6,418,010 B1 | 7/2002 | Sawyer |
| 6,975,507 B2 | 12/2005 | Wang et al. |
| 7,364,126 B2 | 4/2008 | Tsai et al. |
| 8,428,664 B1 | 4/2013 | Wyers |
| 8,528,798 B2 | 9/2013 | Chen |
| 8,737,066 B1 | 5/2014 | Block |
| 8,950,638 B2 | 2/2015 | Wangercyn, Jr. et al. |
| 2007/0181620 A1 | 8/2007 | Carver |
| 2009/0090750 A1 | 4/2009 | Alcenat |
| 2009/0261216 A1 | 10/2009 | Yang et al. |
| 2009/0270050 A1 | 10/2009 | Brown |
| 2011/0192857 A1 | 8/2011 | Rothbaum et al. |
| 2011/0266316 A1 | 11/2011 | Ghalib et al. |
| 2012/0025039 A1 | 2/2012 | Segal |

(Continued)

FOREIGN PATENT DOCUMENTS

JP 2006-279907 A 10/2006

OTHER PUBLICATIONS

FlyGrip—Booming Blue; at http://shop.flygrip.com/collections/flygrip-unmounted/products/booming-blue; Sep. 20, 2013.

(Continued)

*Primary Examiner* — Idowu O Osifade
(74) *Attorney, Agent, or Firm* — Louis J. Hoffman; William E. Markov

(57) ABSTRACT

An apparatus that facilitates one-handed use of a mobile device has a finger brace coupled a plurality of flexible lengths. At least one of the flexible lengths is coupled to an intermediate point of the finger brace. Each of the flexible lengths is coupled to the mobile device at its rear-facing back. At least two of the flexible lengths are coupled at opposed ends of the rear-facing back. The length of the flexible lengths and where they are coupled to the brace and mobile device are such that two fingers of the user's hand can press against the finger brace on opposed sides of the intermediate point to brace the mobile device when the two fingers are between the finger brace and the mobile device.

20 Claims, 6 Drawing Sheets

(56) References Cited

U.S. PATENT DOCUMENTS

| | | | |
|---|---|---|---|
| 2012/0031937 A1* | 2/2012 | Baker | A45C 11/00 224/217 |
| 2012/0042476 A1 | 2/2012 | Karmatz | |
| 2012/0043452 A1 | 2/2012 | Karmatz | |
| 2012/0048873 A1 | 3/2012 | Hyseni | |
| 2012/0113572 A1 | 5/2012 | Gaddis et al. | |
| 2012/0118770 A1 | 5/2012 | Valls et al. | |
| 2012/0267402 A1 | 10/2012 | Beatty | |
| 2012/0326003 A1 | 12/2012 | Solow et al. | |
| 2013/0146625 A1 | 6/2013 | Karle et al. | |
| 2013/0148271 A1 | 6/2013 | Huang | |
| 2013/0206942 A1 | 8/2013 | Trotsky | |
| 2013/0240580 A1 | 9/2013 | Yu | |
| 2014/0091116 A1 | 4/2014 | Yu | |
| 2015/0115112 A1 | 4/2015 | Noh | |

OTHER PUBLICATIONS

Lazy-Hands—Grip Your Gear; at http://www.lazy-hands.com/buynow.html; Sep. 20, 2013.
Review: Handable Tablet and Cell Phone Holder; at http://www.runaroundtech.com/2013/02/20/review-handable-tablet-and-cell-phone-holder/; Feb. 20, 2013.
Larson, Peter; Review: HB Tune Hand-Held iPhone Case; at http://runblogger.com/2012/06/review-hb-tune-hand-held-iphone-case.html; Jun. 17, 2012.
Wanpool iPhone 6/6S Case Cover with Strap; at http://www.amazon.com/Wanpool-iPhone-Case-Cover-Strap/dp/B00VE74QEE?ie=UTF8&keywords=Wanpool%20iPhone%206%20%2F%206S%20Case%20Cover%20with%20Strap&qid=1465500524&ref_=sr_1_1&sr=8-1; Mar. 31, 2016.
TFY Security Hand-strap for iPhone iPhone Plus Samsung Phone and Other Smartphone, at http://www.amazon.com/.TFY-Security-Hand-strap-Samsung-Smartphones/dp/B00R458WE0?ie=UTF8&keywords=TFY%20Security%20Handstrap%20for%20iPhone%20iPhone%20Plus%20Samsung%20Phone%20and%20Other%20Smartphones&qid=1465500725&ref_=sr_1_2&sr=8-2; Jan. 2015.
5pcs/lot Japanese Mobile Straps Phone Grip Sticker Finger Strap for phones & Small Tablets Phone Holder Secure Comfortable at http://www.aliexpress.com/item/5pcs-lot-Japanese-Mobile-Straps-Phone-Grip-Sticker-Finger-Strap-For-phones-Small-Tablets-Phone-Holder/32277028878.html; Jan. 5, 2015.
HandAble: Easy Cell Phone & Tablet Holder; at http://www.disabled-world.com/assistivedevices/handable.php; Oct. 25, 2015.
2015 Newest Universal 360 Degrees Air Vent Mount Bicycle Car Cell Phone Holder Stands for iPhone 6 Plus/5s/5/4s; at https://web.archive.org/web/20160407232230/http://coolsmartphones.net/product/2015-newest-universal-bicycle-car-cell-phone-holder-with-360-degrees-air-vent-mount-holder-stands-for-iphone-6-plus-5s-5-4s/; Apr. 7, 2015.
HANGaCELL.US; at https://web.archive.org/web/20151025172337/http://2-0-0-0.com/cellphoneholder/google-hangacell-cellphoneholder.html; Oct. 25, 2015.
What is a Popsocket? and Popsockets FAQ; at https://web.archive.org/web/20150417184005/http://www.popsockets.com/pages/learn; Apr. 17, 2015.

* cited by examiner

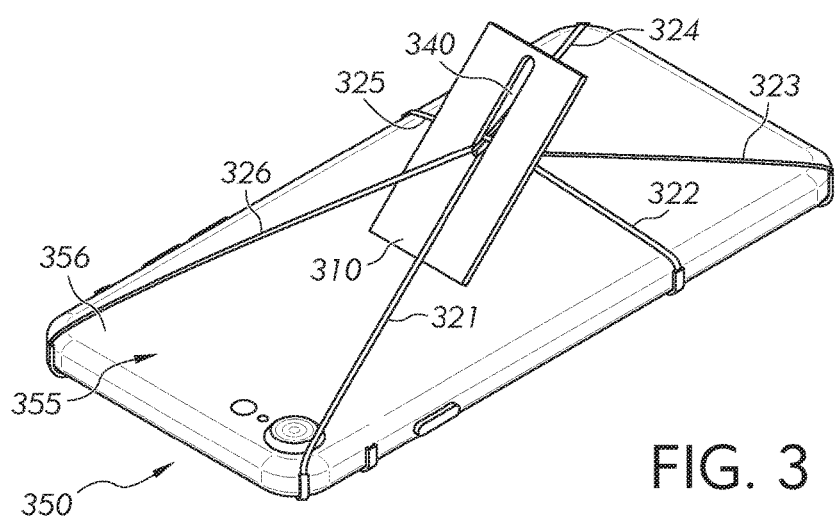
FIG. 3
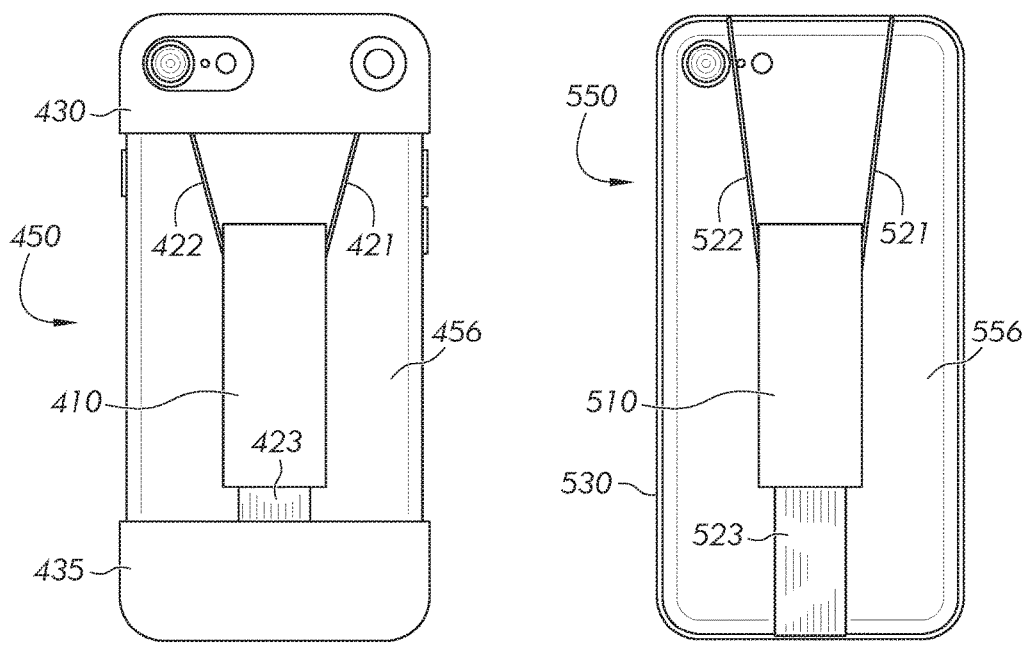
FIG. 4
FIG. 5

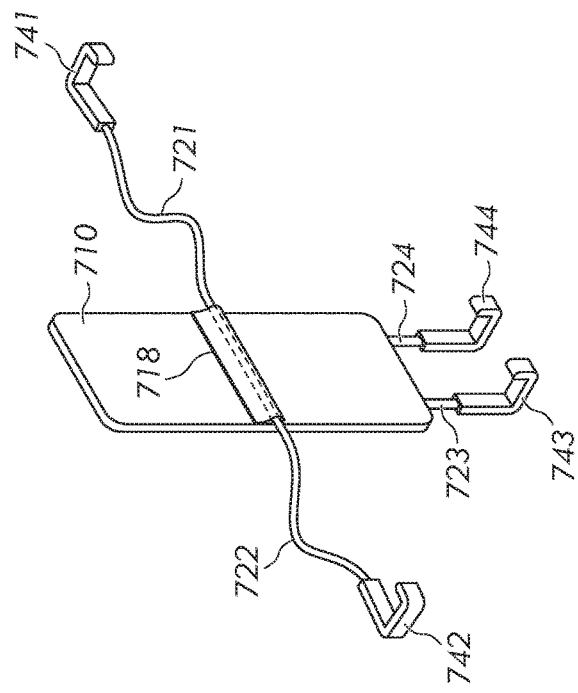
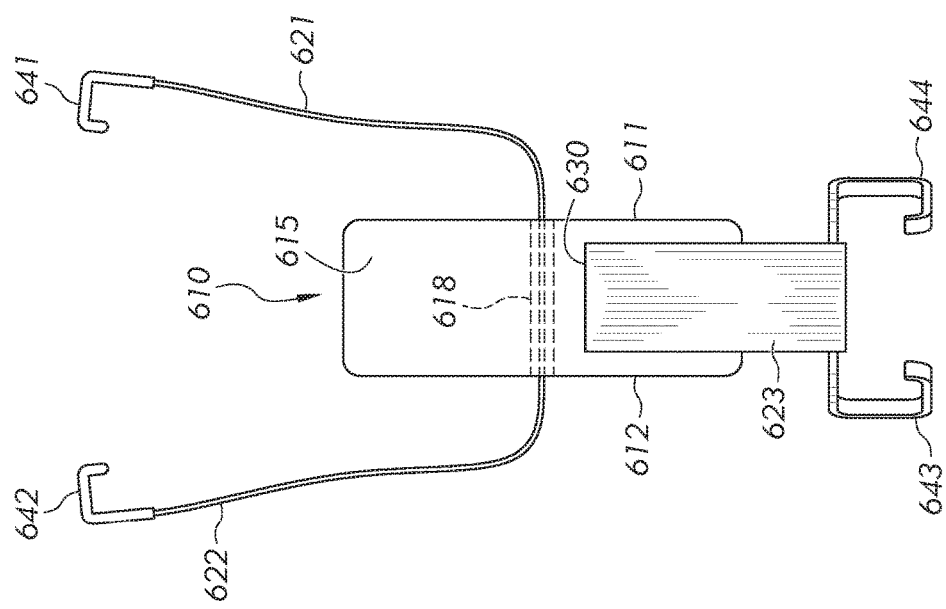
FIG. 7
FIG. 6

APPARATUS TO ASSIST A USER WITH HOLDING A MOBILE DEVICE

BACKGROUND

The field of the present invention relates to accessories for hand-held mobile devices such as mobile phones and computer tablets. In particular, the field of the present invention relates to an apparatus that assists a user with holding a mobile device that has a front-facing display screen, where the user can hold the device in one hand while leaving the thumb of that hand, as well as the user's other hand, free to operate the mobile device. The present disclosure relates to improvements of the technology described in U.S. Pat. No. 9,300,346, by the same inventor, which is hereby incorporated by reference in this application.

Mobile devices, such as cellular phones or tablets, typically have front facing-facing display screens, which can be a touch-screen. Mobile devices also have a rear-facing back that is positioned on the opposite side of the device from the display screen and toward the palm of the user's hand when a small-format mobile device is held with a typical grip.

The rear-facing back can be smooth or otherwise have a low coefficient of friction that causes the device to be difficult to grip. Alternatively, some mobile devices have a rear-facing back that is textured or coated with a material that improves the user's ability to grip the case (e.g., rubber or leather). Additionally, some mobile device users purchase a secondary case that partially or entirely covers the mobile device's rear-facing back. Such secondary cases can be coated with material or have a shape intended to improve the user's ability to grip the mobile device. However, even with a textured or coated griping surface, many users still find difficulty with gripping the mobile device, particularly when operating the mobile device while performing other tasks.

A wide variety of accessories are available for supporting use of a hand-held device. However, conventional accessories generally rely on rigid designs that are not easily adjustable or customizable to a user's individual hand. An additional drawback of rigid designs is that they do not allow a sufficient amount shear or sway between the mobile device and the holding accessory. A certain amount of shear is required to provide user comfort and the ability to reposition one's grip. Such flexibility between mobile device and holding accessory is also required for a smooth transition from holding the device in portrait orientation to holding it in landscape orientation. For example, to change viewing orientation while using a rigid holding accessory, the user may have to detach from or reposition the accessory with respect to the mobile device.

Other designs incorporate flexibility but lack a balancing component to counteract excessive shear between the mobile device and the holding accessory. Thus, the holding accessory can act in a pendulous manner with respect to the mobile device. The result is a somewhat unstable hold on the mobile device because there is nothing to counteract or balance the shearing forces exerted on the holding accessory by the user's hand, which can allow the mobile device to slip from the user's hand.

Additionally, conventional designs often require custom design or fabrication to fit a particular model of mobile device. Each mobile device model is designed to a different form factor, so for holding accessories to properly couple to a mobile device, they must be custom molded to that form factor, for example to avoid having input and output ports or controls blocked by the holding accessory. Alternatively, the mobile device itself may require customization at the factory to support the holding accessory, but this is not desirable because it limits the user's ability to choose another accessory. Some conventional designs may require the user to customize the mobile device or the accessory, which may require skills or tools average end users lack.

SUMMARY

An apparatus to assist a user with holding a mobile device comprises a finger brace and a plurality of flexible lengths. The flexible lengths are coupled to the finger brace. One of the flexible lengths can be coupled to an intermediate point on the finger brace, and one or more of the user's fingers can fit on opposite sides of the intermediate point.

When in use, the flexible lengths are coupled to the mobile device. The flexible lengths are sized so that they are coupleable to the mobile device at different places. The flexible lengths can attach at opposing ends of the mobile device's back. Coupling the flexible lengths to opposing ends provides balancing forces that counteract the pendulum effect that can result from conventional designs. Thus, the apparatus provides the user with a stabile hold on the mobile device because (1) the forces directed across and along the user's hand are balanced and (2) the net force pulls the finger brace toward the rear-facing back of the mobile device.

The apparatus facilitates one-handed use of the mobile device by allowing the user to hold the mobile device with one hand while leaving the thumb of the user's same hand free to operate the mobile device. The fact that the flexible lengths are flexible allows the user to twist the mobile device between landscape or portrait viewing orientation without releasing the finger brace.

The apparatus easily can be adapted for use with many different models of mobile device without the need to custom mold the apparatus to the form factor of particular mobile device because the flexible lengths are couplable to only a few discrete locations on the rear-facing back of the mobile device. Likewise, the apparatus can be attached to a user-provided secondary case. Thus, the apparatus allows for universal or near-universal application to a wide variety of mobile devices or secondary cases for mobile devices.

Objects and advantages pertaining to an apparatus to assist a user with holding a mobile device may become apparent upon referring to the example embodiments illustrated in the drawings and disclosed in the following written description or appended claims.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

FIG. 3 is a perspective view of an embodiment with six flexible lengths.

FIG. 4 is a perspective view of an embodiment with three flexible lengths connected to the mobile device via a partial case having end caps.

FIG. 5 is a perspective view of an embodiment with flexible lengths connected to the mobile device via a partial case having a bumper.

FIG. 6 is a perspective view of an embodiment where certain of the flexible lengths are coupled to the finger brace via a channel in the finger brace.

FIG. 7 is a perspective view of an embodiment where certain of the flexible lengths are coupled to the finger brace via a sleeve of flexible material.

The embodiments depicted are shown only schematically, and not all features may be shown in full detail or in proper proportion. Certain features or structures may be exaggerated relative to others for clarity. The embodiments shown are examples only and should not be construed as limiting the scope of the present disclosure or appended claims.

DETAILED DESCRIPTION OF EMBODIMENTS

Figure 1:
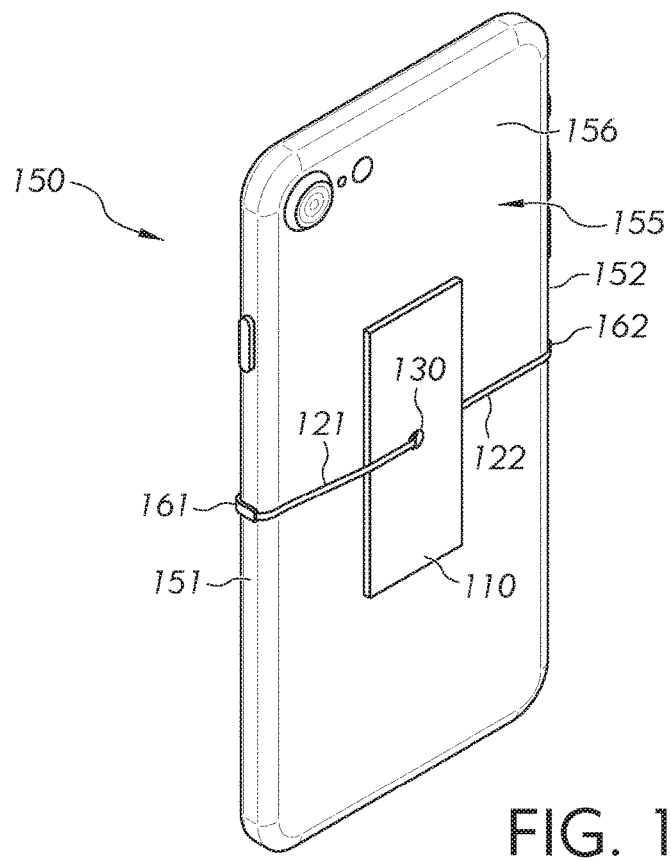
FIG. 1 is a perspective view of an embodiment with two flexible lengths.

An example apparatus to assist with holding a mobile device is shown in FIG. 1. The example apparatus includes finger brace 110 and first and second flexible lengths 121, 122. First and second flexible lengths 121, 122 are coupled to finger brace 110 at intermediate point 130. In turn, first and second flexible lengths 121, 122 are coupled to mobile device 150 at opposing edges 151, 152 of rear-facing back 155. Back 155 of mobile device 150 can include a back surface 156 and can be considered to extend partially or fully around the ends or edges of mobile device 150; there is no requirement to identify an exact point where back 155 is considered to end in any particular direction. Back 155 can be an integrated and possibly removable part of mobile device 150 or a case or other structure covering or affixed to mobile device 150. First and second clips 161, 162 are respectively coupled to the ends of first and second flexible lengths 121, 122 and allow the embodiment of FIG. 1 to be detachably coupled to mobile device 150.

Figure 2:
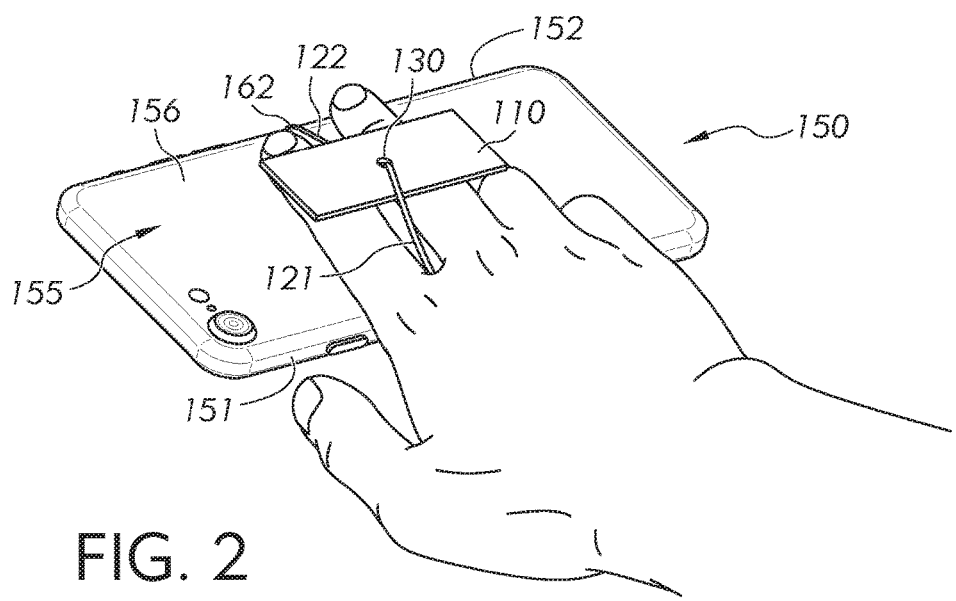
FIG. 2 is a perspective view of the embodiment of FIG. 1 being held by a user's hand.

FIG. 2 shows the embodiment of FIG. 1 in use. In FIG. 2, a user has placed two fingers between finger brace 110 and rear-facing back surface 156 of mobile device 150. The user's fingers are parallel to and on either side of first and second flexible length 121, 122. From this position, the user can press one or both fingers (or more) against finger brace 110 to brace the mobile device, thereby leaving the user's thumb free to operate the mobile device.

Alternatively, the user can assume a cantilevered hold on finger brace 110. In such a hold, the user places only one finger between finger brace 110 and rear-facing back surface 156 of mobile device 150. A second finger is placed against the outward-facing surface of finger brace 110 (on the opposite side of first and second flexible length 121, 122 from the other finger) and presses finger brace 110 against rear-facing back 155 of mobile device 150. Forces exerted on finger brace 110 in such a hold also provide the user with a stable hold on mobile device 150 and likewise facilitate one-handed use.

The finger brace can be made of a material (or combination of materials) that is rigid and that is resilient enough to counterbalance the force applied by the user's fingers with relatively little change in shape, such as plastic, carbon fiber, or metal, or combinations thereof. Alternatively, the finger brace can be moldable from a flat or planar shape into a shape preferred by the user (e.g., a "V" or an "S" shape in profile). In such an embodiment, the finger brace can include a core made of a rigid but malleable material (e.g., a soft metal like aluminum) that can be bent by the user when sufficient force is applied but remains rigid when used as a finger brace in conjunction with holding the mobile device. In alternative embodiments, the finger brace's malleability can be such that it yields over time with continued use so that it conforms to the user. With either alternative, the finger brace's bendability provides a customized and ergonomic feel to the user that provides increases comfort.

The entire surface of the finger brace can be textured, or it can be coated with a material that is soft to the touch or provides padding for the user's fingers (e.g., foam, cloth, leather, or rubber). Some embodiments can have a finger brace that is entirely coated with such a soft material. In other embodiments, only the surface of the finger brace that faces the rear-facing back surface of the mobile device ("finger-bracing surface") is textured or padded. Texturing or padding can allow a better grip without as much slippage.

In the embodiment of FIG. 1, the finger-bracing surface (rear surface 156) is shown as generally flat. However, in other embodiments, the finger-bracing surface can be shaped to match the contours of the user's fingers. For example, the finger-bracing surface can be scalloped or fluted when viewed in profile. Such contours can be pre-molded. Alternatively, the finger-bracing surface can comprise a material that is moldable to the user's fingers so that it can provide a customizable fit.

Figure 8:
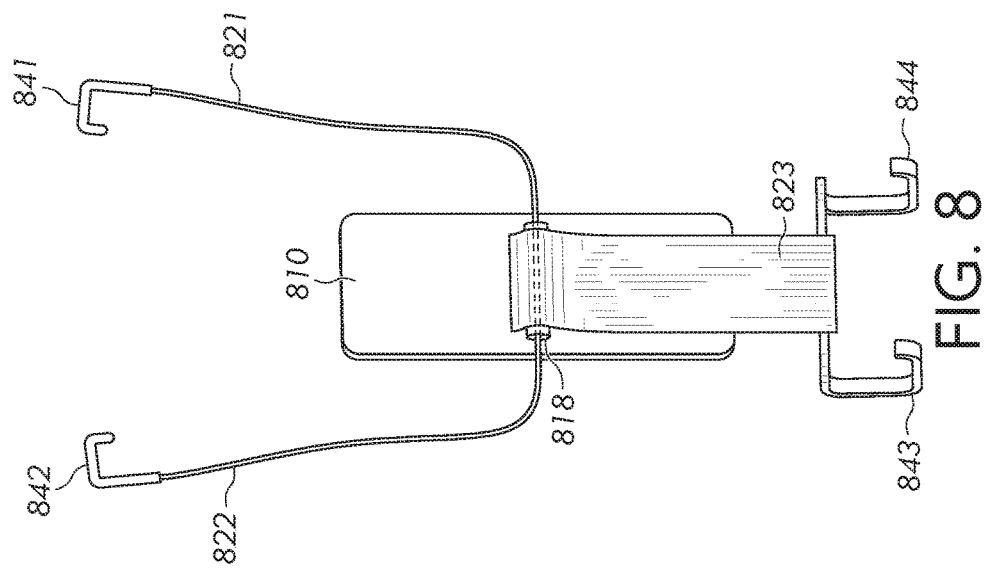
FIG. 8 is a perspective view of an embodiment where certain of the flexible lengths loop around another flexible length without being affixed to the finger brace.

The perimeter of the finger-bracing surface can be generally rectangular, as shown in FIG. 1, or can take other suitable shapes (e.g., triangular, circular, elliptical, hourglass, or figure-8). The shape can be formed as an ornamental or specialty shape, such as to assist marketing campaigns; such shapes can depict an object, animal, or company logo, for example. Alternatively, ornamental designs can be added to the shape with markings or engraving.

In other embodiments (not shown), the finger brace may have straps or loops that wrap around and engage the user's fingers. The loops or straps can be on the finger-bracing side or the opposite side (i.e., outward-facing side) of the finger brace. Such loops or straps provide a more secure grip and provide the user with greater control over the device, particularly when rotating the mobile device between portrait and landscape viewing mode.

In further embodiments (not shown), the finger brace may include tools or attachments. Examples of attachments that could be included in the finger brace are a belt clip, ruler, or camera tripod attachment. Numerous other tool and attachment options are possible.

As seen in FIG. 1, first and second flexible lengths 121, 122 couple to finger brace 110 at intermediate point 130. Intermediate point 130 can be equidistant from the end points of the finger-bracing surface, as shown, or can be positioned at a non-central point on the finger-bracing surface. Alternatively, the intermediate point can be positioned along an edge of the finger-bracing surface. Whether central or not, it can be sized to leave enough space so that at least one finger can fit on each of two opposed sides of intermediate point 40. The radius of the average adult finger is between about 0.5 and about 1.5 centimeters. The intermediate point can be positioned so that less than a length approximating the radius of the average adult finger is provided on each of two opposed sides of the intermediate point, although such a configuration can cause user discomfort, particularly when a user holds the mobile device for an extended period of time. Also, finger brace 110 can have adjustable size (e.g., by sliding, telescoping, folding, cutting, or breaking along pre-scored lines), or allow the intermediate point's location to be changed (e.g., by sliding or allowing the user to adjust it to one of several locations), so that the fit can be customized to the user.

In the embodiment of FIG. 1, first and second flexible lengths 121, 122 are formed from a single piece of material that is threaded through finger brace 110 at an aperture located at intermediate point 130. In an alternative embodiment (not shown), the single piece of material passes through the aperture twice and the resulting two flexible lengths extend from the same side of the finger brace (i.e., the finger-bracing surface) and are held in place by a knot or retaining clip on the opposite side of the finger brace.

Alternatively, the two flexible lengths shown in FIG. 1 can be formed from two separate pieces of material. In such embodiments, both flexible lengths can be coupled to the finger brace at intermediate points. For example, one flexible length can be coupled at the edge of the finger brace and another flexible length can be coupled at an opposing edge of the finger brace. However, one flexible length coupled at an intermediate point is sufficient to provide the finger brace with its bracing ability. Additional flexible lengths can be coupled at other positions on the finger brace to provide additional stability and balance to the finger brace.

The flexibility of first and second flexible lengths 121, 122 enables the user to switch easily from holding mobile device 150 in a portrait orientation to holding it in a landscape orientation, merely by twisting mobile device 150, causing a twist in first and second flexible lengths 121, 122, while the user's fingers continue to press against finger brace 110. The orientation of finger brace 110 with respect the user's fingers does not need to change, which reduces the odds of a user losing his or her grip while switching screen orientations. That same flexibility likewise allows the user to adjust his or her fingers with respect to the rear-facing surface 156 of mobile device 150 for added comfort, in turn allowing a more universal fit without the need for customization. In addition, the first and second flexible lengths 121, 122 increase user comfort by offering a flexible surface against which the user's fingers can press.

Flexible lengths 121, 122 can be made of various flexible materials, including but not limited to cloth, leather, rubber, and plastic. In some embodiments, flexible members 121, 122 can be made of a material that has a dynamic length (e.g., elastic or rubber). Such materials, when stretched, exert a resisting force. That force provides an extra gripping force, assisting the user to hold the device firmly in the user's hand. The resistive force provided by such a material's dynamic length, combined with the flexibility of flexible lengths 121, 122, allows flexible lengths 121, 122 to be twisted and stretched to accommodate the user's hand size and preference. In addition, the more flexible lengths 121, 122 are stretched, the more the resistive force attempts to return each flexible length to its unloaded length, causing the finger brace to be held more tightly against the user's fingers. Dynamic length materials provide additional stability because the resistive force supplied by the material when stretched counterbalances the shear between mobile device 150 and finger brace 110 created by the user's hand. The resistive forces serve to reduce excessive pendulous motion of finger brace 110 because, when first flexible length 121 is placed under a load by the user's bracing activity, the opposing flexible length, second flexible length 121, is unloaded. Thus, the net force pulls finger brace 110 to its resting position near the center of rear-facing back surface 156, which provides the user with greater control over the position and orientation of mobile device 150.

Also, in some embodiments, the elasticity of flexible lengths 121, 122 can hold finger brace 110 against rear-facing back 155 of mobile device 150 when not in use or further facilitate the cantilevered hold as described above and shown in FIG. 13 (with a different embodiment).

Nonetheless, in many embodiments, the flexible lengths can be made of materials that have a relatively static length, such as cloth.

Even if flexible lengths 121, 122 are not made of an elastic material, though, so that each of them have a fixed length, correct establishment of the length of flexible lengths 121, 122, with respect to the user's hand, facilitates easy one-handed handling of the mobile device while the user is operating it. The embodiments promote ease of use because relatively static flexible lengths 121, 122 still serve to limit shear between finger brace 110 and mobile device 150, and because finger brace 110 can automatically angle itself to fit comfortably against the user's fingers, most commonly by balancing forces on either side of intermediate point 130, accommodating a wide array of different user holds.

In some embodiments, one or more of the flexible lengths can be a strap (e.g., rectangular in both cross-section and in plan view). Other embodiments can use alternative arrangements or materials for the flexible lengths, e.g., a string, cord, or lace, or a plurality of straps, strings, cords, or laces. Any suitable shape can be used.

Flexible lengths 121, 122 are shown as having uniform thicknesses. In alternative embodiments, the thicknesses of each flexible length, or certain of them, can vary along the length or can differ when compared to the other flexible lengths. The length of the flexible lengths can vary from one to another as well.

Embodiments, such as in FIG. 1, in which flexible lengths are coupled to the finger brace via a single piece of material passing through an aperture, allow the user to adjust the equilibrium position of finger brace 110. The aperture of finger brace 110 allows the user to adjust the relative lengths of first and second flexible lengths 121, 122 by sliding finger brace 110 along the piece of material that forms first and second flexible lengths 121, 122. Thus, the user can further customize the embodiment to provide desired levels of balance and stability regardless of whether the flexible lengths are made of elastic or non-elastic materials.

In some embodiments, the flexible lengths are formed integrally with or otherwise permanently attached to the finger brace. However, in other embodiments, the finger brace can attach to the flexible lengths via hooks, snaps, or clips. Such removable attachment mechanisms allow the user to remove the finger brace and replace it with a different finger brace. Embodiments, such as those of FIG. 1, in which the flexible lengths are threaded through an aperture, also allow replacement of the finger brace.

In other embodiments, the apparatus can be provided to the user without a finger brace. Instead the flexible lengths form or are coupled to a holder for a finger brace. Thus, the user is free to choose any suitable object to serve as the finger brace. This feature allows the user to choose a more utilitarian object such as a tool or writing implement, or a purely decorative object, as a finger brace.

Returning to the embodiment of FIG. 1, first and second flexible lengths 121, 122 are long enough to allow the user's fingers to fit comfortably between finger brace 110 and rear-facing back surface 156 of mobile device 150, but not so long as to prevent the user from effectively bracing his or her fingers against finger brace 110.

In some embodiments, the length of each flexible length can be adjusted via its coupling to the finger brace. However, other embodiments can allow the length of the flexible lengths to be adjusted where they couple to the mobile device.

Coupling of the flexible lengths to the back of the mobile device can be achieved through the use of hooks or clips. In the embodiment of FIG. 1, first and second flexible lengths 120, 121 are attached to back 155 with first and second clips 161, 162, respectively. First and second clips 161, 162 are coupled to the ends of their respective flexible lengths. First and second clips 161, 162 attach first and second flexible lengths 121, 122 to mobile device 150 by gripping edges 151, 152 of back 155, respectively. The user is afforded maximum support when first and second clips 161, 162 are attached on opposite sides of mobile device 150 at positions roughly mid-way between the top and bottom end of mobile device 150 (considering the top to bottom being the longest dimension of the device). First and second clips 161, 162 allow removable attachment of the embodiment to mobile device 150. Because the attachment to the mobile device is not permanent, the embodiment can be removed and used with another device.

The embodiment of FIG. 1 depicts first and second clips 161, 162 coupled to mobile device 150 at edges 151, 152, at the left and right sides of mobile device 150 (the shorter dimension). In an alternative, first and second flexible lengths 121, 122 attach at the top and bottom of the mobile device.

Clips can be custom molded for a particular model of mobile device. Alternatively, the clips can adjust through a number of preset positions or be freely adjustable through their gripping range.

In other embodiments, adjustable hooks that are bendable are used to couple the flexible lengths to the mobile device. The bendable nature of the hooks allows the user to manually customize the shape of each clip to fit his or her mobile device.

In alternative embodiments, the flexible lengths are adhesively coupled to the mobile device's case, either at the edge or at a point on the rear-facing surface of the case. Either opposing edges or widely separated points on the rear-facing surface near the edges can be considered opposing ends of the rear-facing back. In any such alternative, when tension is applied to the flexible lengths, the forces applied to the finger brace, along a line between the opposing ends, are counterbalanced and thus the finger brace is stabilized.

In the embodiment of FIG. 1, two flexible lengths are sufficient to provide such stability, but additional flexible members can in some circumstances provide increased stability. In embodiments with more than two flexible lengths, the additional flexible lengths need not be connected at opposing ends of the back of the mobile device. However, configurations in which more than two flexible lengths are coupled to the mobile device at opposing ends are expected to provide greater stability. The various features discussed in connection with the embodiment of FIG. 1 can be used in connection with various other embodiments shown in different drawings.

In the embodiment of FIG. 3, finger brace 310 is connected to flexible lengths 321-326 via slot 340 in finger brace 310. Certain pairs of flexible lengths 321-326 are formed from one or more lengths of flexible material that pass through slot 340 and attach to mobile device 350 at opposing ends (e.g., flexible lengths 321, 323 are formed from a single piece of material and flexible lengths 324, 326 are formed from a second piece). On the other hand, flexible lengths 322, 325 do not pass through slot 340 but instead are coupled to flexible lengths 323, 324, respectively.

In the embodiment of FIG. 3, each of flexible lengths 321, 323, 324, 326 are coupled at or near a corner of mobile device 350. Coupling at opposing corners provide still further stability because forces acting on brace 340 in the two-dimensional plane parallel to the rear-facing surface are balanced.

Slot 340 couples flexible lengths 321-326 to finger brace 310 in manner that allows the user to slide finger brace 310 along the pieces of material that form flexible lengths 321, 323, 324, 326. The slideable nature of the coupling between finger brace 310 along flexible lengths 321-326 provides the user with a wide variety of holding positions and greater flexibility in use. The specific features of the embodiment of FIG. 3 can be used in connection with various other embodiments shown in different drawings.

Alternatively, the flexible lengths can couple to the mobile device via a full or partial secondary case that fits over the back of the mobile device. Certain embodiments include a secondary protective case for the mobile device, e.g., packaged or sold with the embodiment. Certain secondary protective cases are customized to fit one or a few models of mobile devices, as opposed to all types of mobile phones. Customization is required to accommodate cameras, control buttons, ventilation holes, USB outlets, headphone jacks, etc. that are specific to a particular model of mobile phone. The need for customization can be reduced or eliminated if the secondary case included with embodiment is only a partial case or a bumper, as shown in FIGS. 4 and 5, respectively.

In the embodiment of FIG. 4, a partial case having upper half 430 and lower half 435 couples first, second, and third flexible lengths 421, 422, 423 to mobile device 450. First and second flexible lengths 421, 422 are attached to upper half 430 of the partial case and third flexible length 423 is attached to lower half 435 of the partial case. First, second, and third flexible lengths 421, 422, 423 are in turn attached to finger brace 410. The specific features of the embodiment of FIG. 4 can be used in connection with various other embodiments shown in different drawings.

Alternatively the partial case may be a bumper that attaches to edges of the mobile device around its circumference. FIG. 5 depicts such an embodiment. In the embodiment of FIG. 5, bumper 530 couples to mobile device 550 at its edges. First, second, and third flexible lengths 521, 522, 523 are attached at various point around the circumference of bumper 530. First, second, and third flexible lengths 521, 522, 523 are in turn attached to finger brace 510. The specific features of the embodiment of FIG. 5 can be used in connection with various other embodiments shown in different drawings.

FIG. 6 depicts a different embodiment in a state of detachment from a mobile device. Finger brace 610 is coupled to first, second, and third flexible lengths 621, 622, 623. Third flexible length 623 is coupled to finger-bracing surface 615 of finger brace 610. First and second flexible lengths 621, 622 connect to finger brace 610 at edges 611, 612 respectively. Specifically, as seen in FIG. 6, first and second flexible lengths 621, 622 are formed from a single piece of material that passes through an elongated aperture, tunnel 618, in finger brace 610. In alternative embodiments, tunnel 618 can be replaced with a groove or channel open on one side in which a piece of flexible material is retained to form first and second flexible lengths 621, 622. Tunnel 618 acts as an intermediate point, with fingers positioned along it on either side to allow bracing of finger brace 610. In addition, third flexible length 623 is coupled to finger brace 610 at intermediate point 630. Alternatively, the user can place his or her fingers on either side of intermediate point 630, or depending on the spacing between tunnel 618 and intermediate point 630, the user's fingers can straddle both tunnel 618 and intermediate point 630.

Also with reference to FIG. 6, third flexible length 623 is strap-like in shape and terminates in adjustable hooks 643, 644. FIG. 6 also depicts adjustable hooks 641, 642 that are respectively attached to first and second flexible lengths 621, 622. Coupling the embodiment of FIG. 6 is achieved by coupling hooks 641, 642 to a first edge of the back of a mobile device (e.g., the upper edge) at locations spaced apart from one another and hooks 643, 644 to an opposing end (e.g., the lower edge). Thus, the embodiment of FIG. 6 effectuates a three-point coupling to the mobile device. Three-point coupling provides many of the same benefits as an embodiment that couples at or near all four corners because first and second flexible lengths 621, 622 together counterbalance the force applied on the brace by third flexible length 623. In addition, because first and second flexible lengths 621, 622 are spaced apart from one another, first and second flexible lengths 621, 622 counterbalance each other adding perpendicular stability. The specific features of the embodiment of FIG. 6 can be used in connection with various other embodiments shown in different drawings.

The embodiment of FIG. 7 includes finger brace 710 coupled to first, second, third, and fourth flexible lengths 721, 722, 723, 724. First and second flexible lengths 721, 722 are formed from a single string and are coupled to finger brace 710 using sleeve 718 of flexible material through which the string passes, which sleeve is attached (such as sewn) to finger brace 710. Sleeve 718 can have a rigid member (not shown) inserted through it to ensure that the forces exerted on sleeve 718 by first and second flexible lengths 721, 722 do not deform sleeve 718. Sleeve 718 acts as the intermediate point, with fingers positioned along it on either side to allow bracing of finger brace 710. On the other hand, third and fourth flexible lengths 723, 724 are each coupled to finger brace 710 at the edge of finger brace 710.

Also seen in FIG. 7 are hooks 741, 742, 743, 744 that enable detachable coupling of the embodiment to a mobile device. Hooks 741, 742, 743, 744 can each be placed at a corner of the mobile device. At least hooks 741, 742 can be coupled on an opposing end of the mobile device from hooks 743, 744. In instances in which flexible lengths are fairly short, such as lengths 723, 724, in some embodiments, they can be formed integrally with their associated hooks 743, 744, of the same or similar material, and can be less flexible. The specific features of the embodiment of FIG. 7 can be used in connection with various other embodiments shown in different drawings.

In further embodiments, at least some of the flexible lengths can be coupled to the finger brace or the other flexible member in a manner that does not involve attachment. For example, FIG. 8 shows finger brace 810 coupled to first, second, and third flexible lengths 821, 822, 823. Third flexible length 823 is coupled to finger brace 810 at an intermediate point. On the other hand, first and second flexible lengths are not connected to either finger brace 810 or third flexible length 823. First and second flexible lengths 821, 822 are formed from a single piece of flexible material. In use, first and second flexible lengths 821, 822 are coupled to the mobile device at their respective ends 841, 842, and the loop formed by first and second flexible lengths 821, 822 is routed through a crevice between third flexible length 823 and finger brace 810. Optionally, rigid sleeve 818 can be positioned where first and second flexible lengths 821, 822 contact third flexible length 823 to prevent deformation of third flexible lengths 823. In alternative embodiments, rigid sleeve 818 has a rubber or non-slip coating that holds first and second flexible lengths 821, 822 in place against third flexible length 823. The specific features of the embodiment of FIG. 8 can be used in connection with various other embodiments shown in different drawings.

Figure 9:
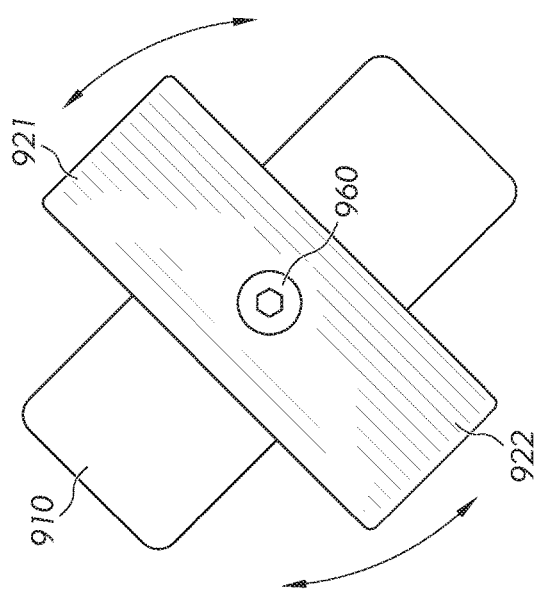
FIG. 9 is a top view of an embodiment where the flexible lengths and the finger brace are attached by an intermediate coupler that allows the flexible lengths and finger brace to rotate with respect to each other.
Figure 10:
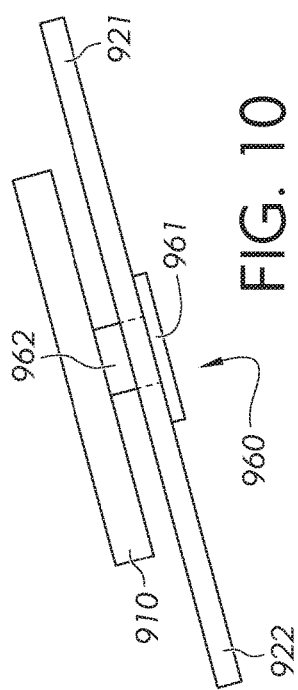
FIG. 10 is a side view of the embodiment of FIG. 9.

FIGS. 9 and 10 depict part of an embodiment in which finger brace 910 is attached to a piece of flexible material that forms first and second flexible lengths 921, 922 via intermediate piece 960. Intermediate piece 960 couples finger brace 910 to first and second flexible lengths 921, 922 in a manner that allows finger brace 910 to rotate with respect to first and second flexible lengths 921, 922. Finger brace 910 and intermediate piece 960 are attached to each other in a fixed relationship at an intermediate point of finger brace 910. First and second flexible lengths 921, 922 are coupleable at opposing ends of a mobile device. As shown in FIG. 10, intermediate piece 960 has flange 961 and post 962 and passes through an eyelet or hole in the length of flexible material that forms first and second flexible lengths 921, 922. Flange 961, because it is larger than the eyelet, retains the length of flexible material on post 962. Intermediate piece 960 allows finger brace 910 to rotate with respect to first and second flexible lengths 921, 922 and thus, the mobile device. Intermediate piece 960 facilitates the user's ability to easily rotate the mobile device between landscape and portrait viewing orientations.

Although the embodiment of FIGS. 9-10 has intermediate piece 960 attached to finger brace 910 in a fixed manner, other embodiments have an intermediate piece that is rotatably attached to the finger brace and fixedly attached to the flexible lengths. Still further variations have the intermediate piece rotatably connected to both the finger brace and flexible lengths. The features of the embodiment of FIGS. 9-10 can be used in connection with various other embodiments shown in different drawings.

Figure 11:
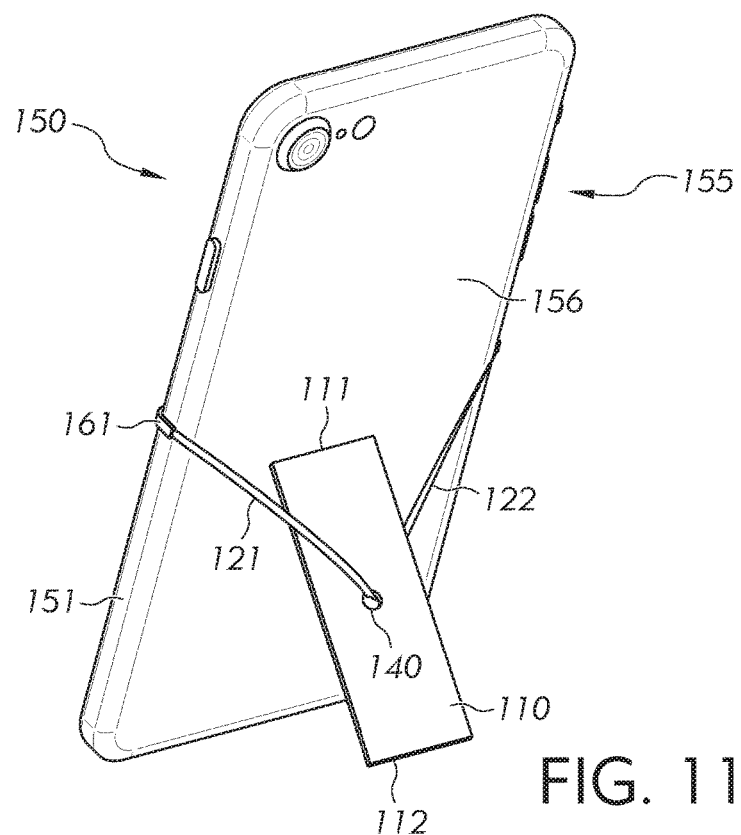
FIG. 11 is a perspective view of the embodiment of FIG. 1 with the finger brace positioned as a stand.

In many embodiments, the finger brace can be used as a stand. In FIG. 11, the embodiment of FIG. 1 is shown positioned as a stand. The stand feature is accomplished by the user placing one end of finger brace 110 against rear-facing back surface 156 of mobile phone 150. Finger brace 110 is held in place by friction and by the force of first and second flexible lengths 121, 122 pulling finger brace 110 toward rear-facing back surface 156.

When in stand configuration, friction between finger brace 110 and rear-facing back surface 156 can be increased by including tips 111, 112 at the ends of finger brace 110. Tips 111, 112 can be rubber or some other material with a high coefficient of friction. The material can be added to both ends, as shown, to allow finger brace 110 to act as a stand in either of two directions, or just at one end, to save cost. The material can be added to additional edges of finger brace 110 to allow for different stand configurations, such as the side edges, thereby allowing the stand to create a shallower angle between the mobile device and the surface on which it is rested. The specific features of the embodiment of FIG. 1 can be substituted for use in connection with various other embodiments shown in different drawings.

In some embodiments, the finger brace can have an extendable length to support the stand function to allow the user to adjust the angle between the mobile device and the surface. In other embodiments, particularly embodiments that include a secondary case, a groove can be present on the rear-facing surface to assist in holding the finger brace in place. Multiple grooves provide the user with a selection of different resting angles, allowing the user to increase or decrease the angle at which the mobile device is held off of the desk or other flat surface, allowing the user to select the most appropriate angle for desired use (e.g., portrait or landscape orientation).

Figure 12:
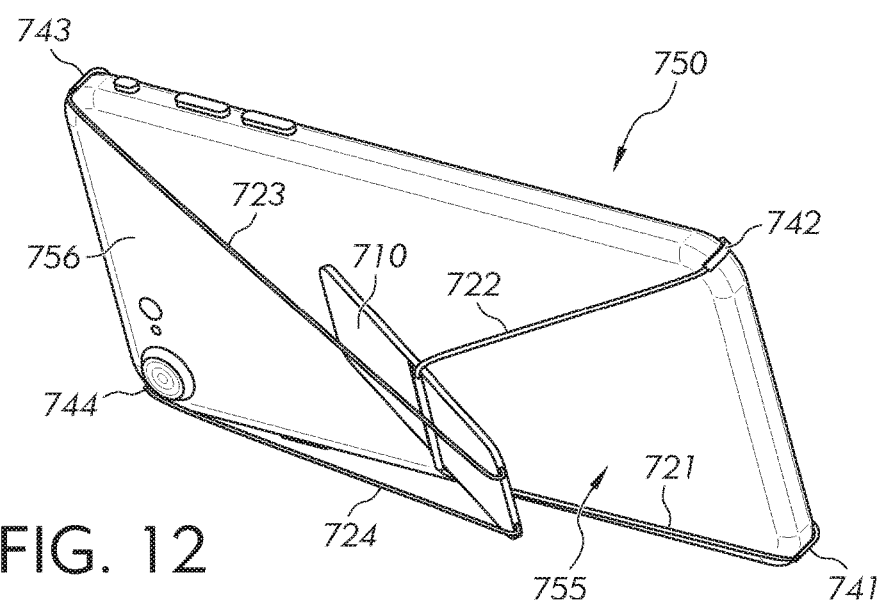
FIG. 12 is a perspective view of the embodiment of FIG. 7 with the finger brace positioned as a stand.

FIG. 12 shows the embodiment of FIG. 7 positioned as a stand (in a manner similar to that that shown in FIG. 11 for the embodiment of FIG. 1) holding mobile device 750. Finger brace 710 is frictionally engaged with rear-facing back surface 756 of back 755 of the mobile device to which the embodiment of FIG. 7 is attached.

Figure 13:
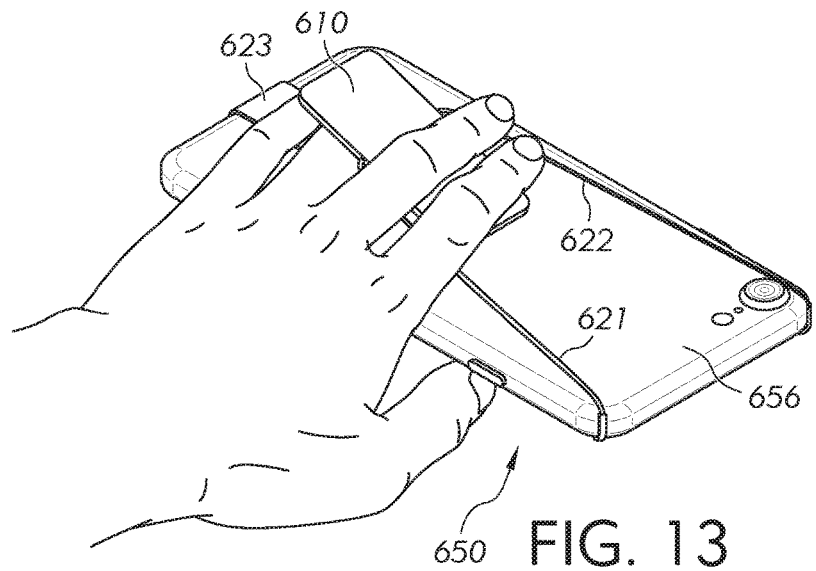
FIG. 13 is a perspective view showing the embodiment of FIG. 6 being held by a user's hand with one finger between the finger brace and the mobile device.
Figure 14:
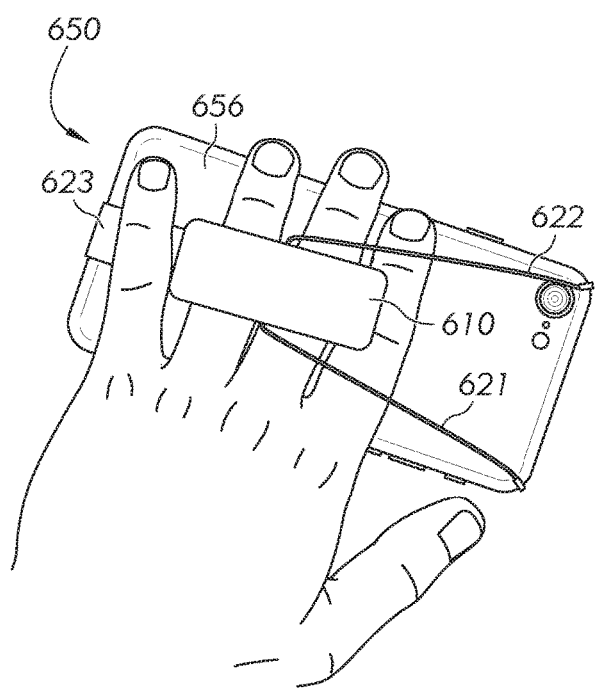
FIG. 14 is a perspective view showing the embodiment of FIG. 6 being held by a user's hand with more than one finger between the finger brace and the mobile device.
Figure 15:
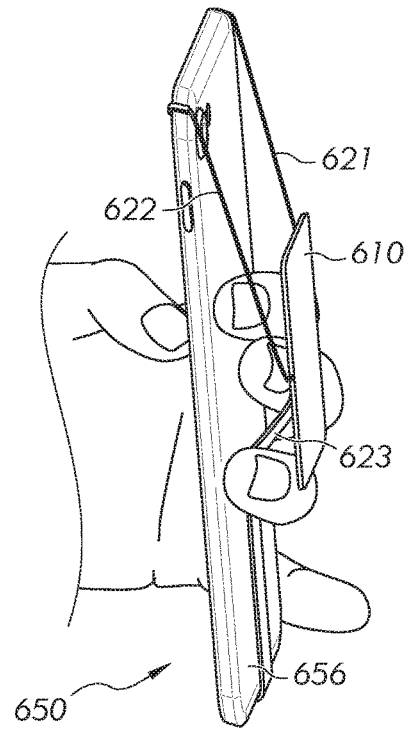
FIG. 15 is a side view of FIG. 14.

FIGS. 13-15 show the embodiment of FIG. 6 in use. FIG. 13 shows a cantilevered hold by the user, in which one of the user's fingers is placed between finger brace 610 and rear-face back surface 656 of mobile device 650 and a second finger is placed on the opposite side of finger brace 610. FIG. 14 shows a standard hold in which two of the user's fingers are placed between finger brace 610 and rear-facing back surface 656 of mobile device 650. FIG. 15 is a side view of FIG. 14.

It is intended that equivalents of the disclosed example embodiments and methods shall fall within the scope of the present disclosure or appended claims. It is intended that the disclosed example embodiments and methods, and equivalents thereof, can be modified while remaining within the scope of the present disclosure or appended claims.

In the foregoing Detailed Description, various features can be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof.

In the appended claims, if the provisions of 35 USC §112 ¶6 are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC §112 ¶6 are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim.

What is claimed is:

1. An apparatus to assist a user with holding a mobile device having (i) a front-facing display screen and (ii) a rear-facing back, the apparatus comprising:
   (a) a finger brace sized and shaped to brace at least two fingers of one hand of the user when at least one of the fingers is placed on each of two opposed sides of an intermediate point of the finger brace; and
   (b) a plurality of flexible lengths coupled to the finger brace, at least one of the flexible lengths being coupled to the finger brace at the intermediate point;
   (c) wherein the flexible lengths are sized (i) to be couplable to the mobile device at a plurality of different locations at opposed edges of the back of the mobile device, and (ii) so that the at least two fingers can press against the finger brace to brace the mobile device when the one hand is holding the mobile device;
   whereby the apparatus facilitates one-handed use of the mobile device by allowing the user to hold the mobile device while leaving a thumb of the user's one hand free to operate the mobile device.

2. The apparatus of claim 1 wherein each of the plurality of flexible lengths are made from an elastic material.

3. The apparatus of claim 1 wherein at least one of the plurality of flexible lengths is a strap.

4. The apparatus of claim 1 wherein at least one of the plurality of flexible lengths is attached adjacent to each of a plurality of corners of the mobile device.

5. The apparatus of claim 1 wherein at least one of the plurality of flexible lengths, other than the at least one of the flexible lengths coupled at the intermediate point, is coupled to the finger brace at an edge of the finger brace.

6. The apparatus of claim 1 wherein all of the plurality of flexible lengths are coupled to the finger brace at the intermediate point via a rotational coupler coupled to both the finger brace and the plurality of flexible lengths, whereby the finger brace is rotationally independent of the plurality of flexible members.

7. The apparatus of claim 1 further comprising a plurality of hooks, each positioned at an end of one of the plurality of flexible lengths that is distal from the finger brace, wherein each of the hooks is structured to couple its respective flexible length to the mobile device, wherein each of the plurality of hooks is made from a malleable material.

8. The apparatus of claim 1 further comprising a plurality of clips, each positioned at an end of one of the plurality of flexible lengths that is distal from the finger brace, wherein each clip is structured to couple its respective flexible length to the mobile device.

9. The apparatus of claim 1 further comprising a case structured to be detachably coupled to the back of the mobile device, wherein at least one of the plurality of flexible lengths is coupled to the case.

10. An apparatus to assist a user with holding a mobile device having (i) a front-facing display screen and (ii) a rear-facing back, the apparatus comprising:
    (a) a finger brace having an aperture at an intermediate point of the finger brace, the finger brace being sized and shaped to brace at least two fingers of one hand of the user when at least one of the fingers is placed on each of two opposed sides of the intermediate point; and
    (b) a plurality of flexible lengths coupled to the finger brace, at least two of the flexible lengths forming a single piece of material that passes through the aperture;
    (c) wherein the plurality of flexible lengths are sized (i) to be couplable to the mobile device at a plurality of different locations at opposed edges of the back of the mobile device, and (ii) so that the at least two fingers can press against the finger brace to brace the mobile device when the one hand is holding the mobile device;
    whereby the apparatus facilitates one-handed use of the mobile device by allowing the user to hold the mobile device while leaving a thumb of the user's one hand free to operate the mobile device.

11. The apparatus of claim 10 wherein the at least two flexible lengths are sized to be coupleable to the mobile device at the opposed edges of the back of the mobile device.

12. The apparatus of claim 10 wherein the at least two flexible lengths are perpendicular to a surface of the finger brace where they traverse the aperture.

13. The apparatus of claim 12 wherein the aperture is an elongated slot in the surface of the finger brace.

14. The apparatus of claim 10 wherein the aperture is a tunnel parallel to the surface of the finger brace.

15. The apparatus of claim 10 wherein at least one of the plurality of flexible lengths is attached adjacent to each of a plurality of corners of the mobile device.

16. The apparatus of claim 10 wherein at least one of the plurality of flexible lengths, other than the at least two of the flexible lengths that pass through the aperture, is coupled to the finger brace at an edge of the finger brace.

17. An apparatus to assist a user with holding a mobile device having (i) a front-facing display screen and (ii) a rear-facing back having a first edge and second edge at an opposite side of the back from the first edge, the apparatus comprising:
    (a) a finger brace sized and shaped to brace at least two fingers of one hand of the user when at least one of the fingers is placed on each of two opposed sides of an intermediate point of the finger brace; and
    (b) three flexible lengths coupled to the finger brace, at least one of the flexible lengths being coupled to the finger brace at the intermediate point;
    (c) wherein a first of the three flexible lengths is sized to be coupleable to the first edge, a second and third of the flexible lengths are sized to be coupleable to different points spaced apart from each other along the second edge, and the three flexible lengths are sized so that the at least two fingers can press against the finger brace to brace the mobile device when the one hand is holding the mobile device;
    whereby the apparatus facilitates one-handed use of the mobile device by allowing the user to hold the mobile device while leaving a thumb of the user's one hand free to operate the mobile device.

18. The apparatus of claim 17 wherein at least one of the plurality of flexible lengths, other than the at least one of the flexible lengths coupled at the intermediate point, is coupled to the finger brace at an edge of the finger brace.

19. The apparatus of claim 17 wherein the first flexible length is a strap coupled to the finger brace at the intermediate point.

20. The apparatus of claim 19 wherein each of the plurality of flexible lengths are made from an elastic material.

* * * * *